United States Patent
Zuniga

[19]

[11] Patent Number: 5,939,777
[45] Date of Patent: Aug. 17, 1999

[54] HIGH ASPECT RATIO INTEGRATED CIRCUIT CHIP AND METHOD FOR PRODUCING THE SAME

[75] Inventor: Edgar R. Zuniga, Sherman, Tex.

[73] Assignee: Texas Instruments Incorporated, Dallas, Tex.

[21] Appl. No.: 08/986,051

[22] Filed: Dec. 5, 1997

Related U.S. Application Data

[60] Provisional application No. 60/032,529, Dec. 6, 1996.
[51] Int. Cl.[6] .................................................. H01L 23/495
[52] U.S. Cl. ............................................ 257/676; 257/666
[58] Field of Search .................................... 257/777, 778, 257/676, 666

[56] References Cited

U.S. PATENT DOCUMENTS 5,399,898  3/1995  Rostoker ................................. 257/777

*Primary Examiner*—David B. Hardy
*Attorney, Agent, or Firm*—Wade James Brady, III; Richard L. Donaldson

[57] ABSTRACT

An integrated circuit chip package (10) including a high aspect ratio integrated circuit chip (12) is disclosed. The chip (12) has a length (L1) than is greater than three times its width (L2). The chip includes a plurality of circuit functional blocks (14), each having a plurality of integrated circuit components and bond pads (16) for the input and output of signals. In one embodiment, the circuit functional blocks (14) are aligned in parallel to form a row of circuit functional blocks. The high aspect ratio integrated circuit chip (12) requires less wafer area than a comparable low aspect ratio chip, thus allowing more chips to be made from a single semiconductor wafer at a lower cost per chip. Moreover, the disclosed method for producing a high aspect ratio integrated circuit chip package (10) minimizes the risk of cracking the high aspect ratio integrated circuit chip (12) during the packaging process.

17 Claims, 1 Drawing Sheet

HIGH ASPECT RATIO INTEGRATED CIRCUIT CHIP AND METHOD FOR PRODUCING THE SAME

This application claims priority under 35 USC § 119(e)(1) of provisional application number 60/032,529 filed Dec. 6, 1996.

TECHNICAL FIELD OF THE INVENTION

This invention relates generally to the field of integrated circuit chips and more particularly to a high aspect ratio integrated circuit chip and method for producing the same.

BACKGROUND OF THE INVENTION

An integrated circuit chip of the type commonly used in electronic devices typically comprises several circuit functional blocks, each having many electronic components and at least one bond pad for the input and output of electronic signals. The integrated circuit chip is typically mounted on a leadframe, which has a plurality of electrical leads extending therefrom. Wire bonds connect each bond pad on the chip to at least one of the leads.

The integrated circuit chip and leadframe are encased in plastic to electrically and mechanically insulate the integrated circuit components from the outside world. Only the leads emerge from the plastic casing to allow the input and output of electronic signals to the integrated circuit chip.

The wire bonds connecting the bond pads to the leads are flexible, and must be prevented from contacting each other to avoid short-circuiting. The wire bonds must therefore be made as short as possible, so that the injection molding process which produces the plastic casing does not inadvertently push the wire bonds together. Likewise, the leads must be separated from each other by a minimum distance so as to prevent short-circuiting between the leads.

In addition to the foregoing design factors, integrated circuit chips have traditionally been designed with a square or rectangular shape. When rectangular shapes have been used, the ratio of the length of the chip to its width, known as the aspect ratio, has typically been limited to 3:1 or less. This was due to the common understanding that elongated shapes would be prone to breakage during the fabrication and packaging process.

The need for spacing between leads and between wire bonds results in a need to increase the perimeter length of the integrated circuit chip when a large number of leads are used. However, the squarish, low aspect ratio shapes used for integrated circuit chips result in relatively short perimeter lengths.

These competing considerations have, in many cases, resulted in integrated circuit chips being enlarged beyond the size strictly necessary to accommodate the circuit functional blocks contained therein. These enlarged integrated circuit chips have sufficient perimeter length to permit connection to a large number of leads. However, because semiconductor wafers are available at a fixed cost per unit area, the wasted space in an enlarged integrated circuit chip adds considerably to the cost of the integrated circuit chip package.

SUMMARY OF THE INVENTION

Therefore, a need has arisen for an integrated circuit chip and method for producing the same that overcomes the disadvantages and deficiencies of the prior art.

An integrated circuit chip package including a high aspect ratio integrated circuit chip is disclosed. The chip has a length that is greater than three times its width. The chip includes a plurality of circuit functional blocks, each having a plurality of integrated circuit components and bond pads for the input and output of signals. In one embodiment, the circuit functional blocks are aligned in parallel to form a row of circuit functional blocks.

A method for producing a high aspect ratio integrated circuit chip package is also provided. The method comprises the step of patterning an integrated circuit on a semiconductor wafer. An integrated circuit chip comprising the integrated circuit is then detached from the semiconductor wafer. The integrated circuit chip has a first pair of sides having a first length and a second pair of sides having a second length, the first length being greater than three times the second length. The integrated circuit chip is mounted on a die pad of a leadframe, and an encapsulant is molded around the integrated circuit chip and the die pad of the leadframe.

A technical advantage of the present invention is that the high aspect ratio integrated circuit chip requires less wafer area than comparable low aspect ratio chips, thus allowing more chips to be made from a single semiconductor wafer at a lower cost per chip. Another technical advantage is that the method for producing a high aspect ratio integrated circuit chip package minimizes the risk of cracking the integrated circuit chip during the packaging process. Another technical advantage is that circuit functional blocks on the high aspect ratio integrated circuit chip may be arranged in a regular pattern, thus reducing the setup time and expense for the wire bonder used in the packaging process. Another technical advantage is that a high aspect ratio integrated circuit chip package in accordance with the present invention exhibits reduced, uniform signal propagation delay.

BRIEF DESCRIPTION OF THE DRAWINGS

For a more complete understanding of the present invention, and the objects and advantages thereof, reference is now made to the following descriptions taken in connection with the accompanying drawings in which.

DETAILED DESCRIPTION OF THE INVENTION

Figure 1:
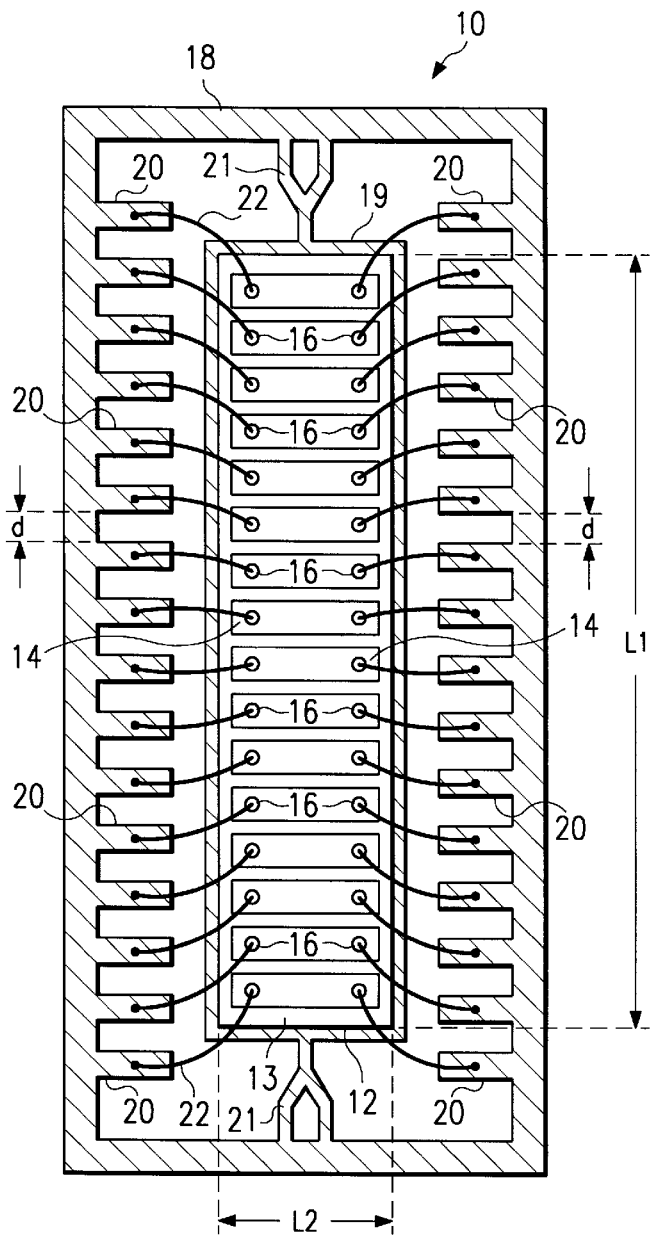
FIG. 1 is a top plan view of a high aspect ratio integrated circuit chip package in accordance with the present invention.

Referring to FIG. 1, an integrated circuit chip package 10 constructed in accordance with the present invention is shown. Package 10 includes an integrated circuit chip 12 which has a plurality of circuit functional blocks 14 patterned on a substrate 13. Each circuit functional block 14 has bond pads 16 for the input and output of signals. In this example, chip 12 receives a sixteen-bit parallel input signal and generates a sixteen-bit parallel output signal. Each circuit functional block 14 receives one input bit at one bond pad 16, performs computation and/or signal processing based on the received input bit and signals from other circuit functional blocks 14, and generates one output bit at a second bond pad 16.

Chip 12 is mounted on a die pad 19 of a leadframe 18. Die pad 19 is rectangular in shape and has only slightly larger dimensions than chip 12. Die pad 19 is connected to the outer structure of leadframe 18 by means of two tie bars 21 located at opposite ends of die pad 19. Tie bars 21 have a standard Y-tie design to provide adequate stabilization of die pad 19.

Die pad 19 preferably has a width no greater than three times the width L2 of chip 12. Otherwise, the different thermal expansion characteristics of die pad 19 and chip 12 will cause a gap to develop between die pad 19 and the mold compound which is used to encapsulate chip 12 and die pad 19. This problem, known as delamination, is minimized when die pad 19 is only slightly wider than chip 12.

Leadframe 18 has a plurality of leads 20 extending toward die pad 19. Leads 20 may be shaped to establish electrical contact with sites on a printed circuit board (not shown). For example, leads 20 may be formed into a standard "gull-wing" shape. Adjacent leads 20 are separated from each other by a uniform separation distance d. Wire bonds 22 establish electrical connections between leads 20 and respective bond pads 16.

Chip 12 is rectangular in shape and has a length L1 and a width L2. The ratio of L1 to L2, known as the aspect ratio of chip 12, is approximately 4:1. This high aspect ratio allows circuit functional blocks 14 to be arranged side-by-side in the compact configuration shown, which uses a minimal surface area on chip 12. Moreover, this high aspect ratio configuration allows bond pads 16 to be connected to leads 20 with short wire bonds 22, while leads 20 are separated from each other by an adequate separation distance d.

Advantageously, package 10 exhibits signal propagation delay which is both more uniform and lower than that exhibited by prior art integrated circuit chip packages. This is because, unlike some prior art packages, wire bonds 22 are approximately equal in length, as are leads 20. This uniformity in signal propagation distance between the ends of leads 20 and the bond pads 22 of circuit functional blocks 14 results in uniform signal propagation delay. Moreover, the high aspect ratio design of package 10 allows for relatively short leads 20 and wire bonds 22, thus reducing the signal propagation delay and increasing the overall processing speed for any circuit which includes package 10.

Figure 2:
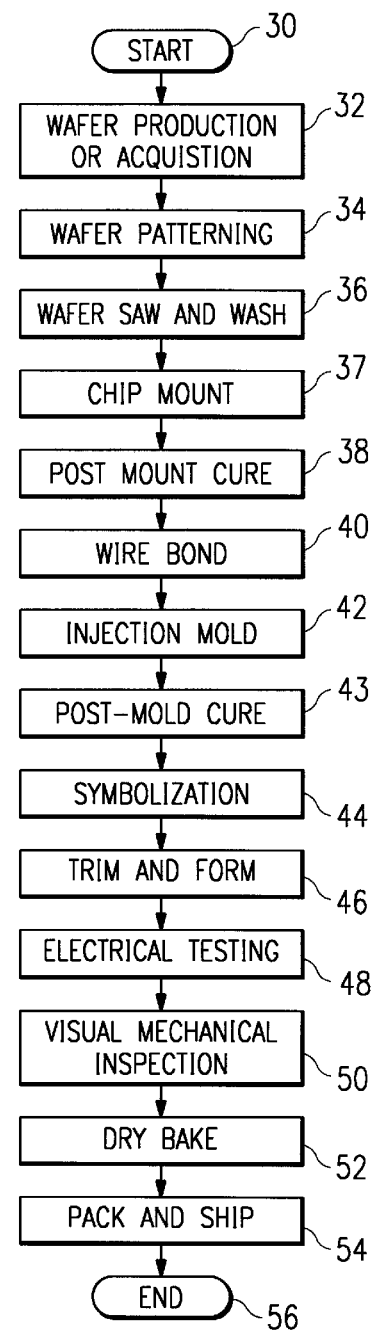
FIG. 2 is a flow chart of a method for producing the high aspect ratio integrated circuit chip package in accordance with the present invention.

Referring to FIG. 2, a flowchart illustrating a method for producing integrated circuit chip package 10 is shown. The method begins at step 30 and proceeds to step 32, where a semiconductor substrate wafer of the type commonly used in integrated circuit fabrication is either manufactured or acquired from a vendor of such wafers. At step 34, an array of identical circuits is patterned onto the semiconductor substrate wafer using suitable microlithographic techniques such as epitaxy, ion implantation and etching. At step 36, the semiconductor substrate wafer is placed on an adhesive surface and sawed along sawing streets into many rectangular pieces, each piece having one of the identical patterned circuits. Integrated circuit chip 12 may comprise one of those pieces. To prevent cracking of chip 12 during sawing, chip 12 is preferably sawed first along its two long sides, then along its two short sides.

At step 37, an epoxy is placed upon die pad 19 of leadframe 18. This is preferably accomplished using epoxy dispenser needles spaced approximately 0.05 inches apart along the length of die pad 19. This ensures that epoxy is uniformly distributed along the length of chip 12 when mounted on die pad 19. Alternatively, another die attach medium may be used to secure integrated circuit chip 12 to die pad 19.

Integrated circuit chip 12 is then removed from the adhesive surface and mounted on die pad 19, where integrated circuit chip 12 is held in place by the epoxy. The process of removing chip 12 from the adhesive surface is accomplished by lifting chip 12 using one or more vacuum pick-up tips on the upper surface of chip 12, and simultaneously pushing chip 12 up from underneath with at least one die eject needle. The die eject needle(s) penetrate the adhesive surface and lift chip 12 up out of contact with the adhesive.

While in the past only a single die eject needle has been required to lift small, low aspect ratio chips from the adhesive surface, more than one die eject needle may be needed to support and lift chip 12, depending on the length L1 of chip 12. The number of die eject needles preferably used to lift chip 12, and the spacing between the needles, is shown in Table A. The die eject needles are preferably centered along both the length and width of chip 12. The use of multiple die eject needles in step 37 for high aspect ratio chips provides additional support and prevents excessive stress and cracking during step 37.

TABLE A

| Chip length (mils) | Needles | Needle spacing (mils) |
|---|---|---|
| <100 | 1 | n/a |
| 100–319 | 2 | 80 |
| 320–400 | 3 | 80 |

Proceeding to step 38, the integrated circuit chip assembly comprising integrated circuit chip 12 and leadframe 18 is placed in a curing oven and heated to a temperature of approximately 175° C. to evaporate epoxy solvents and chemically cure the epoxy.

At step 40, the integrated circuit chip assembly is placed in a wire bonder of the type commonly used in integrated circuit fabrication. The wire bonder attaches wire bonds 22 between bond pads 16 on integrated circuit chip 12 and leads 20 on leadframe 18.

Before a production run of integrated circuit chips is begun, the wire bonder is programmed with the locations of bond pads 16 on chip 12 and leads 20 of leadframe 18. In the past, each new chip design would differ from other chip designs in the placement of circuit functional blocks and bond pads, thereby necessitating the reprogramming of the wire bonder before each production run.

However, in accordance with the present invention, chip 12 has a regular, linear array of circuit functional blocks 14 and bond pads 16. This regular design may be used for any integrated circuit chip package requiring the same number of leads 20. Thus, the wire bonder need only be programmed before one production run, and the same programming may be used in all subsequent production runs for the same chip size and number of leads. As a result, package 10 becomes less time-consuming and expensive to produce.

At step 42, the integrated circuit chip assembly is placed in an injection molder of the type commonly used in integrated circuit fabrication. Integrated circuit chip 12 and leadframe 18 are surrounded by a thin, rectangular mold, with only leads 20 protruding from the sides of the mold. A heated liquid plastic encapsulant, or mold compound, is injected into the mold to encase integrated circuit chip 12, die pad 19 and wire bonds 22. Integrated circuit chip package 10 is then removed from the injection molder and the mold compound cools and hardens into the thin, rectangular shape defined by the mold.

At step 43, the molded plastic encapsulant formed in step 42 is cured. In this example, integrated circuit chip package 10 is placed in an oven and maintained at a temperature of approximately 175° C. for approximately four hours. Package 10 is then removed from the oven and allowed to cool.

At step 44, the plastic encapsulant is marked with a symbol identifying the type of integrated circuit chip 12 included in package 10, the chip manufacturer and other identifying information. This marking step is performed using either known laser etching methods or with an ink, which is then cured in a curing oven.

At step 46, leads 20 of leadframe 18 are trimmed and formed into a desired shape. Prior to this step, leads 20 projected straight inward from leadframe 18, which is part of a leadframe assembly containing many identical leadframes. At step 46, which may be performed in an automatic press, the ends of leads 20 and tie bars 21 are detached from leadframe 18 and the leadframe assembly. If leads 20 are joined together near their inner ends by surplus metal for mechanical support, then this metal is also removed at step 46. Finally, leads 20 are formed by the press into the desired shape, such as the gull-wing shape previously described.

Proceeding to step 48, package 10 is placed on a testing platform where leads 20 are aligned with electrical contact surfaces. Electrical signals are supplied to leads 20 to test the operation of integrated circuit chip 12 and the electrical contacts formed by wire bonds 22. At step 50, package 10 is inspected visually to determine whether any visible errors have been made in any of the previous steps.

At step 52, package 10 is dry-baked to reduce the moisture content of the plastic encapsulant to 0.05% or less. Excess moisture in the plastic encapsulant could cause the encapsulant to fracture during subsequent high-temperature operations, such as soldering leads 20 to a circuit board. In this example, the dry bake step 52 begins with placing package 10 on a rack with other similar packages. The rack is placed in a dry bake oven, which heats package 10 to a temperature of approximately 125° C. for approximately eight hours to remove moisture from package 10. Package 10 is then removed from the dry bake oven and allowed to cool.

At step 54, package 10 is placed into a sealed, evacuated pouch, along with other similar packages, for shipment to a purchaser of the packages. At step 56, the integrated circuit chip packaging method ends.

While the invention has been particularly shown and described by the foregoing detailed description, it will be understood by those skilled in the art that various other changes in form and detail may be made without departing from the spirit and scope of the invention.

What is claimed is:

1. An integrated circuit chip comprising:
   a substrate having a substantially rectangular shape, and having an aspect ratio of greater than three to one; and
   a plurality of circuit components patterned onto the substrate.

2. The integrated circuit chip of claim 1, further comprising a plurality of circuit functional blocks aligned in parallel on the substrate and forming a row of circuit functional blocks.

3. The integrated circuit chip of claim 2, wherein each circuit functional block comprises:
   a plurality of the circuit components;
   a first bond pad operable to receive input signals and to cause the input signals to be conducted to a first one of the circuit components; and
   a second bond pad operable to receive output signals from a second one of the circuit components.

4. An integrated circuit chip package comprising:
   a leadframe having a die pad and a plurality of leads; and
   an integrated circuit chip having a substrate mounted on the die pad of the leadframe and a plurality of circuit components patterned on a surface of the substrate, the substrate having a substantially rectangular shape, the substrate having a first pair of sides having a first length and a second pair of sides having a second length, the first length being greater than three times the second length.

5. The integrated circuit chip of claim 4, wherein the integrated circuit chip further comprises a plurality of bond pads on the surface of the substrate.

6. The integrated circuit chip of claim 5, further comprising a plurality of wire bonds operable to electrically connect selected ones of the bond pads to respective selected ones of the leads.

7. The integrated circuit chip of claim 4, further comprising a plurality of circuit functional blocks aligned in parallel on the substrate and forming a row of circuit functional blocks.

8. The integrated circuit chip of claim 5, wherein each circuit block comprises:
   a plurality of the circuit components;
   a first bond pad operable to receive input signals and to cause the input signals to be conducted to a first one of the circuit components; and
   a second bond pad operable to receive output signals from a second one of the circuit components.

9. The integrated circuit chip package of claim 4, further comprising an encapsulant surrounding the die pad and the substrate.

10. The integrated circuit chip package of claim 4, wherein the die pad of the leadframe has a width no greater than three times the second length of the substrate.

11. The integrated circuit chip package of claim 4, wherein the leadframe further comprises:
    an outer structure connected to the leads; and
    a tie bar connecting the die pad to the outer structure of the leadframe.

12. The integrated circuit chip package of claim 11, wherein the tie bar of the leadframe comprises a Y-shaped tie bar.

13. The integrated circuit chip package of claim 4, wherein the plurality of leads of the leadframe comprises a plurality of gull-wing shaped leads.

14. An integrated circuit chip comprising:
    a substrate having a substantially rectangular shape and having an aspect ratio of about four to one; and
    a plurality of circuit components patterned onto the substrate.

15. The integrated circuit chip of claim 14, further comprising a plurality of circuit functional blocks aligned in parallel on the substrate and forming a row of circuit functional blocks.

16. The integrated circuit chip of claim 15, wherein each circuit functional block comprises:
    a plurality of the circuit components;
    a first bond pad operable to receive input signals and to cause the input signals to be conducted to a first one of the circuit components; and
    a second bond pad operable to receive output signals from a second one of the circuit components.

17. An integrated circuit chip package comprising:
    a leadframe having a die pad and a plurality of leads; and an integrated circuit chip having a substrate mounted on the die pad of the leadframe and a plurality of circuit components patterned on a surface of the substrate, the substrate having a substantially rectangular shape, the substrate having a first length and a width, the length being up to about four times greater than the width.

* * * * *